United States Patent
Murayama

(10) Patent No.: US 8,742,399 B2
(45) Date of Patent: Jun. 3, 2014

(54) NANOGRAIN MATERIAL AND PHOTOELECTRIC CONVERSION DEVICE

(75) Inventor: Koji Murayama, Nagaokakyo (JP)

(73) Assignee: Murata Manufacturing Co., Ltd., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 13/429,523

(22) Filed: Mar. 26, 2012

(65) Prior Publication Data

US 2012/0175593 A1 Jul. 12, 2012

Related U.S. Application Data

(63) Continuation of application No. PCT/JP2010/065814, filed on Sep. 14, 2010.

(30) Foreign Application Priority Data

Sep. 28, 2009 (JP) .................................. 2009-222931

(51) Int. Cl.
*H01L 29/06* (2006.01)
*H01L 31/00* (2006.01)

(52) U.S. Cl.
USPC .......... 257/25; 257/13; 257/21; 257/E29.071; 257/E31.033; 257/E31.008

(58) Field of Classification Search
USPC .......... 257/13, 14, 21, 25, E29.071, E31.033, 257/E31.008; 136/256
See application file for complete search history.

(56) References Cited

U.S. PATENT DOCUMENTS

| 7,742,322 B2 * | 6/2010 | Sargent et al. ................. 365/129 |
| 2001/0028026 A1 * | 10/2001 | Yonezawa et al. .......... 250/214.1 |
| 2005/0236556 A1 * | 10/2005 | Sargent et al. ............. 250/214.1 |
| 2008/0206565 A1 | 8/2008 | Takahashi et al. |
| 2010/0006153 A1 * | 1/2010 | Rauscher et al. ............. 136/261 |
| 2010/0108984 A1 * | 5/2010 | Cho et al. ........................ 257/13 |

FOREIGN PATENT DOCUMENTS

| JP | 2008-214363 A | 9/2008 |
| WO | WO-3-021694 A2 | 3/2003 |
| WO | WO-2007-73467 A1 | 6/2007 |
| WO | WO-2008-104301 A2 | 9/2008 |
| WO | WO-2008/120626 A1 | 10/2008 |

OTHER PUBLICATIONS

PCT/JP2010/065814 Written Opinion dated Dec. 15, 2010.

* cited by examiner

Primary Examiner — George Fourson, III
Assistant Examiner — Wilner Jean Baptiste
(74) Attorney, Agent, or Firm — Dickstein Shapiro LLP

(57) ABSTRACT

A quantum dot, which is an ultrafine grain, has a core-shell structure having a core portion and a shell portion protecting the core portion. The surface of the shell portion is covered with two kinds of surfactants, a hole-transporting surfactant and an electron-transporting surfactant, which are concurrently present. Moreover, the hole-transporting surfactant has a HOMO level which tunneling-resonates with the valence band of the quantum dot and the electron-transporting surfactant has a LUMO level which tunneling-resonates with the transfer band of the quantum dot. Thus, a nanograin material which has good carrier transport efficiency and is suitable for use in a photoelectric conversion device is achieved.

16 Claims, 9 Drawing Sheets

Fig. 9 - PRIOR ART

Fig. 10 – PRIOR ART
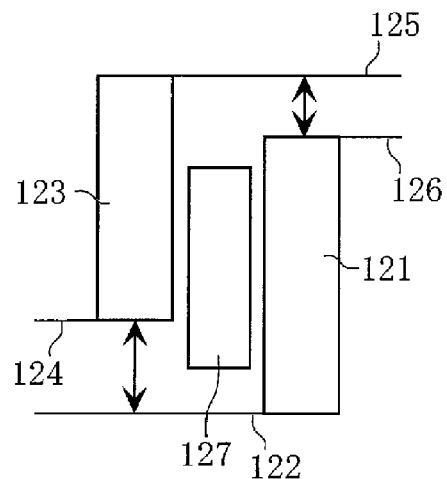
Fig. 11 – PRIOR ART
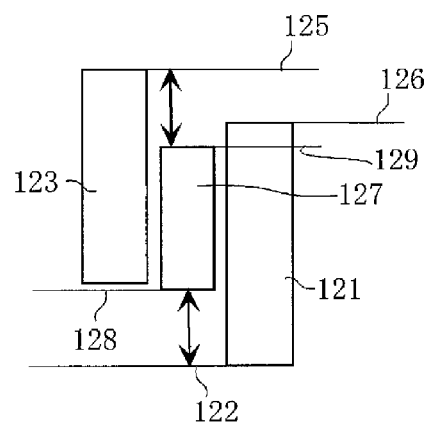

Fig. 12 – PRIOR ART
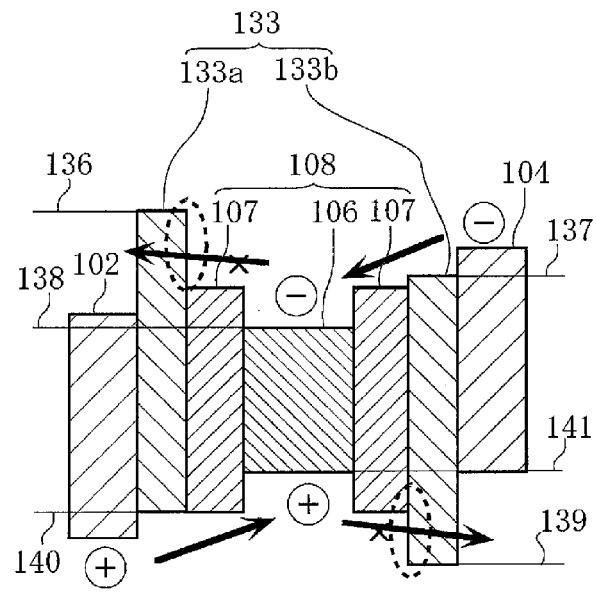
Fig. 13 – PRIOR ART
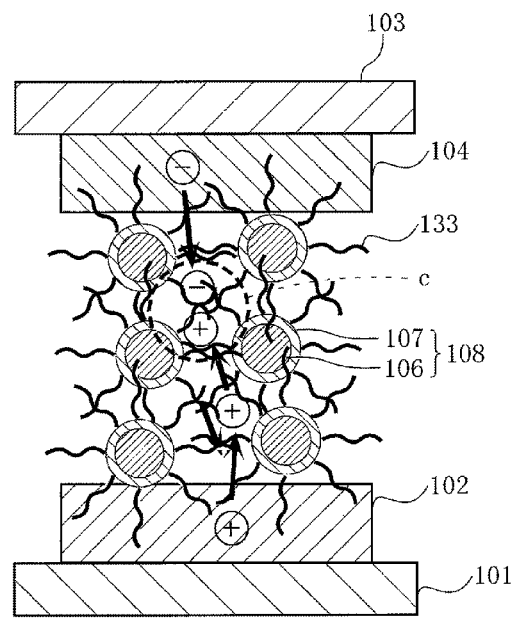

NANOGRAIN MATERIAL AND PHOTOELECTRIC CONVERSION DEVICE

CROSS REFERENCE TO RELATED APPLICATIONS

The present application is a continuation of International application No. PCT/JP2010/065814, filed Sep. 14, 2010, which claims priority to Japanese Patent Application No. 2009-222931, filed Sep. 28, 2009, the entire contents of each of which are incorporated herein by reference.

FIELD OF THE INVENTION

The present invention relates to a nanograin material and a photoelectric conversion device, and more particularly to a nanograin material with the surface of an ultrafine grain covered with a surfactant, and a photoelectric conversion device such as a solar cell and a light emitting diode using the nanograin material.

BACKGROUND OF THE INVENTION

A quantum dot, which is an ultrafine grain having a grain size of 10 nm or less, is excellent in confinement of a carriers (electron and hole), and therefore can easily generate an exciton by electron-hole recombination. Thus, emission of light from a free exciton can be expected and light emission with high emission efficiency and a sharp emission spectrum can be achieved. Furthermore, the quantum dot can be controlled over a wide range of wavelengths using a quantum size effect, and thus attention is given to their application to light emitting devices such as semiconductor lasers and light emitting diodes (LEDs).

By the way, colloidal quantum dots is chemically synthesized in a liquid phase, and usually covered at the surface with organic molecules of a surfactant so that quantum dots do not agglomerate together. That is, the colloidal quantum dot had the disadvantage that the potential barrier is high potential barrier due to low conductivity of a surfactant caused by organic molecules, and therefore photoelectric conversion efficiency via carriers (holes and electrons) is low.

Furthermore, if a conductive polymer or a metallic material is used as a surfactant, a carrier injected into an electrode by application of a voltage passes through the surfactant from an anode to a cathode or from a cathode to an anode, thus making it difficult to efficiently confine the carrier in a quantum dot.

FIG. 9 is a schematic diagram of a photoelectric conversion device on the premise of the use of a conductive surfactant.

The photoelectric conversion device has a quantum dot layer 105 interposed between a hole transport layer 102 formed on the upper surface of an anode 101 and an electron transport layer 104 formed on the lower surface of a cathode 103. The quantum dot layer 105 is covered at the surface with a conductive surfactant 109 so that quantum dots 108 made of a core portion 106 and a shell portion 107 do not agglomerate together. That is, the quantum dot layer 105 has a laminated structure in which a large number of quantum dots 108 are provided in parallel, and the conductive surfactant 109 is interposed between quantum dots 108.

When a voltage is applied between the anode 101 and the cathode 103, a hole is injected into the anode 101 and an electron is injected into the cathode 103. As shown by arrow a and arrow b, the hole and electron as a carrier pass through the conductive surfactant 109, and the hole is transported toward the cathode 103 and the electron is transported toward the anode 101 without being entrapped in the quantum dot 108. That is, if the conductive surfactant 109 is used, the carrier is merely charged, and the carrier cannot be confined in the quantum dot 108.

Thus, techniques for confining a carrier in a quantum dot by using a surfactant having both hole-transporting and electron-transporting ligands have been researched and developed.

For example, Patent Document 1 proposes a nanograin light emitting material having a surfactant made from at least two ligands localized on the surface of the quantum dot, wherein among the ligands, at least one is a hole-transporting ligand and at least one is an electron-transporting ligand.

In a quantum-mechanical system, the state of energy possessed by a molecule corresponds to a molecular orbital where electrons exist, and can be classified into a ground state which is energetically lowest and stable and an excited state which is energetically higher than the ground state. The molecule is in a ground state before being irradiated with light, and molecular orbitals are occupied by electrons in order with the energetically lowest molecular orbital first. Among the molecular orbitals in a ground state, the highest molecular orbital is called a highest occupied molecular orbital (hereinafter referred to as "HOMO"), and the energy level corresponding to HOMO is a HOMO level. On the other hand, when irradiated with light, the molecule is brought into an excited state and molecular orbitals are brought into an empty state where they are not occupied by electrons. Among these molecular orbitals which are not occupied by electrons, the lowest molecular orbital is called a lowest unoccupied molecular orbital (hereinafter referred to as "LUMO"), and the energy level corresponding to LUMO is a LUMO level. Then, the electron moves through a transfer band and the hole moves through a valence band.

In Patent Document 1, as shown in FIG. 10, the HOMO level 122 of an electron-transporting ligand 121 is made lower than the HOMO level 124 of a hole-transporting ligand 123 and the LUMO level 125 of a hole-transporting ligand 123 is made higher than the LUMO level 126 of an electron-transporting ligand 121 to thereby improve efficiency of injecting a carrier into a quantum dot 127.

Furthermore, in Patent Document 1, as shown in FIG. 11, an electron-transporting ligand 121 is selected such that the HOMO level 122 of the electron-transporting ligand 121 is lower than the highest electron level 128 in the valence band of the quantum dot 127, whereby a hole injected into the quantum dot 127 is blocked by the electron-transporting ligand 121, and a hole-transporting ligand 123 is selected such that the LUMO level 125 of the hole-transporting ligand 123 is higher than the lowest electron level 129 in the transfer band of the quantum dot 127, whereby an electron injected into the quantum dot 127 is blocked by the hole-transporting ligand 123.

FIG. 12 is a view explaining the confinement principle of the quantum dot in Patent Document 1.

That is, the quantum dot 108 is made of a core portion 106 and a shell portion 107 covering the core portion 106, and the shell portion 107 is covered with a surfactant 133. The surfactant 133 has a hole-transporting ligand 133a and an electron-transporting ligand 133b, wherein the hole-transporting ligand 133a is localized on the hole transport layer 102 side and the electron-transporting ligand 133b is localized on the electron transport layer 104 side.

An electron from an electron transport layer 104 is easily injected into the core portion 106 since the LUMO level 136 of the hole-transporting ligand 133a is higher than the LUMO level 137 of the electron-transporting ligand 133b, while the hole-transporting ligand 133a is a barrier to an electron and the electron is confined in the core portion 106 since the LUMO level 136 of the hole-transporting ligand 133*a* is higher than the lowest electron level 138 in the transfer band of the core portion 106.

Furthermore, a hole from the hole transport layer 102 is easily injected into the core portion 106 since the HOMO level 139 of the electron-transporting ligand 133*b* is lower than the HOMO level 140 of the hole-transporting ligand 133*a*, while the electron-transporting ligand 133*b* is a barrier to a hole and the hole is confined in the core portion 106 since the HOMO level 139 of the electron-transporting ligand 133*b* is lower than the highest electron level 141 in the valence band of the core portion 106.

That is, the carriers (electron and hole) are confined in the quantum dot 108 by the electron block effect of the hole-transporting ligand 133*a* and the hole block effect of the electron-transporting ligand 133*b*.

Thus, in Patent Document 1, the electron and hole are confined in the core portion 106 to thereby cause recombination of the electron-hole in the core portion 106, whereby an exciton is generated to emit light.

Patent Document 1: Japanese Patent Laid-Open Publication No. 2008-214363 (claim 1, claims 3 to 5)

SUMMARY OF THE INVENTION

In Patent Document 1, however, as shown in FIG. 13, the surfactant 133 has both hole-transporting ligand 133*a* and electron-transporting ligand 133*b*, and therefore a hole and an electron are transported concurrently in the surfactant 133. Thus, the electron and the hole may approach each other with a certain probability, and as shown by c in the figure, the hole and the electron may recombine in the surfactant 133.

If in this way, the hole and the electron recombine before the carrier is confined in the quantum dot 108 (core portion 106), the number of carriers to be confined in the quantum dot 108 decreases and as a result, carrier transport efficiency may be reduced.

Furthermore, in the case of a photoelectric conversion device such as a solar cell, a carrier is generated in a quantum dot when irradiated with light, and the carrier is withdrawn to the outside the quantum dot by exciton absorption. In this case, however, as in the case of injecting a carrier into a quantum dot, a hole and an electron are transported concurrently in a surfactant, the electron and the hole may recombine in the surfactant before the carrier arrives at an electrode and as a result, carrier transport efficiency may be reduced.

The present invention has been made in view of such considerations, and has as an object to provide a nanograin material which has good carrier transport efficiency and is suitable for use in a photoelectric conversion device, and a photoelectric conversion device.

As a result of conducting intensive studies for achieving the aforementioned object, the present inventor has reached the findings that by having surfactants for transporting only electrons and only holes concurrently in a nanograin material and covering a quantum dot, which is an ultrafine grain, at the surface with these two surfactants, carrier recombination in the surfactant can be prevented, and thereby carrier transport efficiency can be improved.

The present invention has been made on the basis of these findings, and the nanograin material according to the present invention is characterized in that the surface of an ultrafine grain is covered with a first surfactant having a hole-transporting characteristic and a second surfactant having an electron-transporting characteristic.

Furthermore, by moving a carrier between the electron-transporting first surfactant and the hole-transporting second surfactant and a quantum dot using tunneling resonance, the carrier can be transported quickly and efficiently without occurrence of phonon bottleneck. For this purpose, the first surfactant is required to have a HOMO level which tunneling-resonates with the valence band of the quantum dot, and the second surfactant is required to have a LUMO level which tunneling-resonates with the transfer band of the quantum dot.

That is, the nanograin material of the present invention is preferably one wherein the first surfactant has a HOMO level which tunneling-resonates with the valence band of the quantum dot which is an ultrafine grain.

Furthermore, the nanograin material of the present invention is preferably one wherein the HOMO level is $-0.2$ to $+0.2$ eV relative to the energy level of the valence band.

Furthermore, the nanograin material of the present invention is preferably one wherein the second surfactant has a LUMO level which tunneling-resonates with the transfer band of the quantum dot which is an ultrafine grain.

Furthermore, the nanograin material of the present invention is preferably one wherein the LUMO level is $-0.2$ to $+0.2$ eV relative to the energy level of the transfer band.

Furthermore, the nanograin material of the present invention is preferably one wherein the ultrafine grain has a core-shell structure made of a core portion and a shell portion covering the core portion.

Furthermore, the photoelectric conversion device according to the present invention is a photoelectric conversion device having a quantum dot layer interposed between a first electrode and a second electrode, wherein the quantum dot layer is formed of the aforementioned nanograin material.

Furthermore, the photoelectric conversion device of the present invention is preferably one wherein an electron transport layer is formed between any one of the first electrode and the second electrode and the quantum dot layer, and a hole transport layer is formed between the other electrode and the quantum dot layer.

According to the nanograin material of the present invention, the surface of an ultrafine grain is covered with a first surfactant having a hole-transporting characteristic and a second surfactant having an electron-transforming characteristic, and therefore the first surfactant can transport only holes and the second surfactant can transport only electrons.

Accordingly, without recombination of a hole and an electron in a surfactant, a carrier generated in a quantum dot by photoirradiation, which is an ultrafine grain, can be efficiently transported to the electrode side, and a carrier injected into an electrode by application of a voltage can be efficiently transported into the quantum dot. Consequently, efficiency of transporting the carrier into the quantum dot (injection efficiency) and efficiency of transporting the carrier from the quantum dot (withdrawal efficiency) can be improved.

Furthermore, the first surfactant has a HOMO level which tunneling-resonates with the valence band of the quantum dot which is an ultrafine grain, for example, $-0.2$ to $+0.2$ eV relative to the energy level of the valence band, whereby the hole moves quickly between the quantum dot and the surfactant by tunneling resonance.

Furthermore, the second surfactant has a LUMO level which tunneling-resonates with the transfer band of the quantum dot which is an ultrafine grain, for example, $-0.2$ to $+0.2$ eV relative to the energy level of the transfer band, whereby the electron moves quickly between the quantum dot and the surfactant by tunneling resonance.

In this way, by moving the carrier using tunneling resonance, efficient carrier transportation can be achieved without occurrence of phonon bottleneck.

Furthermore, according to the photoelectric conversion device of the present invention, in a photoelectric conversion device having a quantum dot layer interposed between the first electrode and the second electrode, the quantum dot layer is formed of the nanograin material described above, and therefore carrier transport efficiency is good at the quantum dot layer, conversion of an electric signal to a light signal or conversion of a light signal to an electric signal can be performed with high efficiency and various practical photoelectric conversion devices can be achieved.

BRIEF DESCRIPTION OF THE DRAWINGS

FIG. 9 is a sectional view schematically showing carrier transportation when a conductive surfactant is used;

FIG. 10 is a relational diagram of an energy level showing a carrier injection principle in Patent Document 1.

FIG. 11 is a relational diagram of the energy level showing a carrier confinement principle in Patent Document 1.

FIG. 12 is a schematic diagram for explaining the carrier confinement principle in Patent Document 1; and FIG. 13 is a schematic diagram for explaining the problems in Patent Document 1.

DETAILED DESCRIPTION OF THE INVENTION

Embodiments of the present invention will now be described in detail with reference to accompanying drawings.

Figure 1:
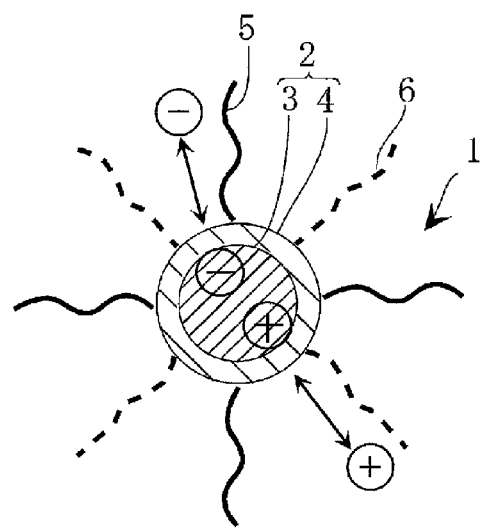
FIG. 1 is a sectional view schematically showing one embodiment of a nanograin material according to the present invention.

FIG. 1 is a sectional view schematically showing one embodiment of a nanograin material according to the present invention.

The nanograin material 1 is constituted such that a quantum dot 2, which is an ultrafine grain, has a core-shell structure having a core portion 3 and a shell portion 4 protecting the core portion 3, and the surface of the shell portion 4 is covered with a hole-transporting surfactant (first surfactant) 5 having a hole-transporting characteristic and an electron-transporting surfactant (second surfactant) 6 having an electron-transporting characteristic.

Here, a core material forming the core portion 3 is not particularly limited as long as it is a semiconductor material which exhibits a photoelectric conversion effect, and InP, CdSe, CdS, PbSe and the like may be used and as for example, ZnS may be used as a shell material forming the shell portion 4.

In this way, by covering the surface of the ultrafine grain 2 with the hole-transporting surfactant 5 and the electron-transporting surfactant 6 concurrently present, only holes and only electrons are transported via their respective surfactants (hole-transporting surfactant 5 and electron-transporting surfactant 6). As a result, electron-hole recombination in the surfactant is inhibited, thus making it possible to efficiently transport carriers (electron and hole).

For example, carriers are generated in the quantum dot 2 by photoirradiation, and upon occurrence of exciton absorption, carriers are withdrawn from the quantum dot 2. Among withdrawn carriers, a hole is transported through the interior of the hole-transporting surfactant 5 to the anode side and an electron is transported through the interior of the electron-transporting surfactant 6 to the cathode side. That is, the hole-transporting surfactant 5 and the electron-transporting surfactant 6 each form a bulk-hetero network, the hole-transporting surfactant 5 transports only holes and the electron-transporting surfactant 6 transports only electrons.

Furthermore, when carriers are injected into an electrode by application of a voltage, a hole injected into an anode is transported through the interior of the bulk-hetero network of the hole-transporting surfactant 5 to the interior of the quantum dot 2. Furthermore, an electron injected into a cathode is transported through the interior of the bulk-hetero network of the electron-transporting surfactant 6 to the interior of the quantum dot 2.

In this way, the hole and the electron are transported by way of a different pathway through the hole-transporting surfactant 5 and the electron-transporting surfactant 6 to the anode and the cathode, respectively, or the interior of the quantum dot 2, and therefore the hole and the electron do not approach each other to undergo recombination, and can be efficiently transported. This allows photoelectric conversion of a light signal to an electric signal and photoelectric conversion of an electric signal to a light signal to be performed with high efficiency.

As such a hole-transporting surfactant 5, a material having a ligand introduced into a low-molecular material for a hole transport layer may be used.

As the low-molecular material for a hole transport layer, for example, N,N'-diphenyl-N,N'-bis(3-methylphenyl)-1,1'-biphenyl-4,4'-diamine (hereinafter referred to as "TPD") expressed by chemical formula (1), 4,4'-bis[N-(1-naphthyl)-N-phenyl-amino]biphenyl (hereinafter referred to as "α-NPD") expressed by chemical formula (2), 4,4',4"-tris(2-naphthylphenylamino)triphenylamine (hereinafter referred to as "2-TNATA") expressed by chemical formula (3), N,N'-7-di(1-naphthyl)-N,N'-diphenyl-4,4'-diaminobiphenyl) (hereinafter referred to as "Spiro-NPB") expressed by chemical formula (4), 4,4',4"-tris(3-methylphenylphenylamino) triphenylamine (hereinafter referred to as "m-MTDATA") expressed by chemical formula (5), and derivatives thereof may be used.

[Chemical Formula 1]

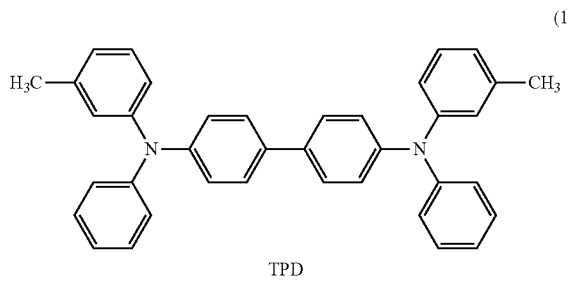

TPD

[Chemical Formula 2]

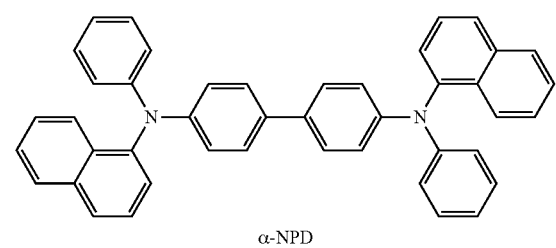

α-NPD

[Chemical Formula 3]

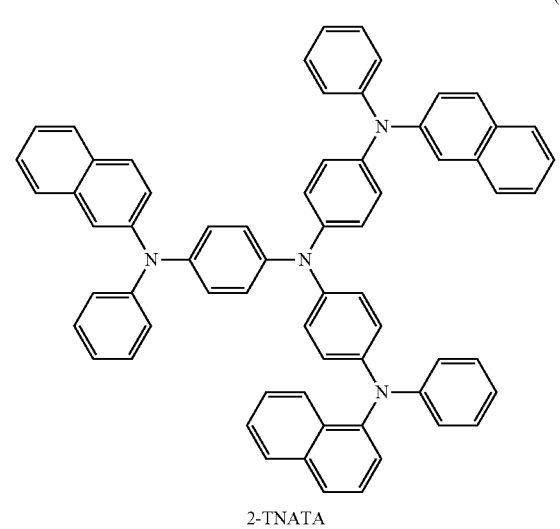

2-TNATA

[Chemical Formula 4]

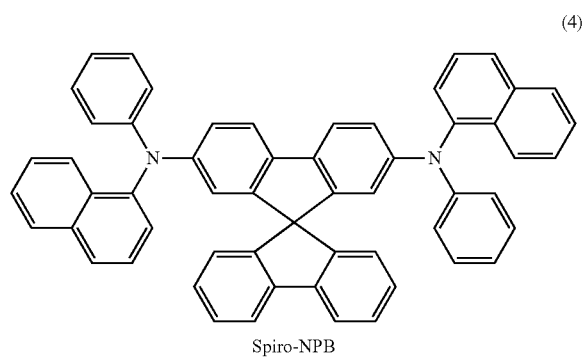

Spiro-NPB

[Chemical Formula 5]

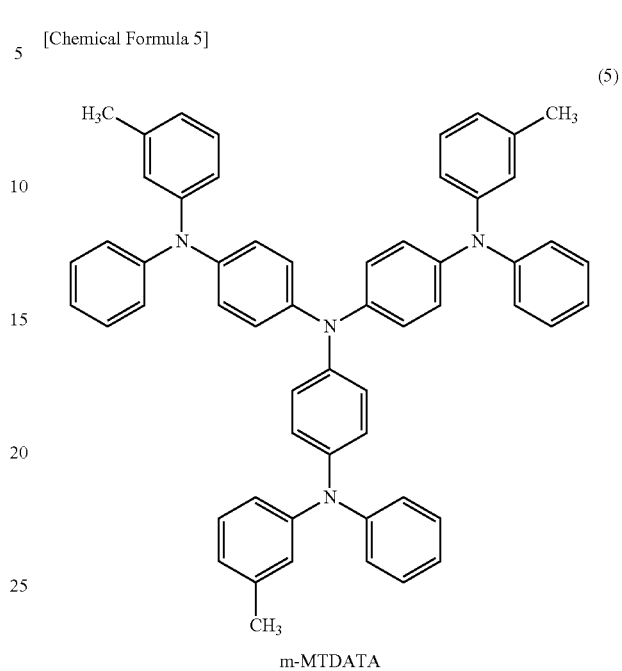

m-MTDATA

Furthermore, the ligand is not particularly limited as long as it is a polar group and for example, one or more thiol group (—SH), amino group (—NH$_2$), carboxyl group (—COOH), carbonyl group (—CO), nitro group (—NO$_2$), phosphino group (—PH$_2$), phosphoroso group (—PO) and the like may be used.

Accordingly, as the hole-transporting surfactant 5, for example, a TPD-thiol ligand having a thiol group introduced into TPD, an α-NPD-amino ligand having an amino group introduced into α-NPD or the like may be used. The surfactant may be dispersed in a nonpolar solvent if one ligand is introduced, and may also be dispersed in a polar solvent if two or more ligands are introduced.

Moreover, a macromolecular material such as poly(3,4-ethylenedioxythiophene):poly(styrene sulphonate) (hereinafter referred to as "PEDOT:PSS") expressed by chemical formula (6) may be suitably used as a material for a hole transport layer, but is not preferable for use in a material for a hole-transporting surfactant. This is because the macromolecular material has a large molecular size causing steric hindrance, so that the adjacent distance cannot be reduced, and resultantly the surface coverage of the quantum dot 2 decreases leading to a reduction in quantum yield or the density of the quantum dot layer cannot be increased.

[Chemical Formula 6]

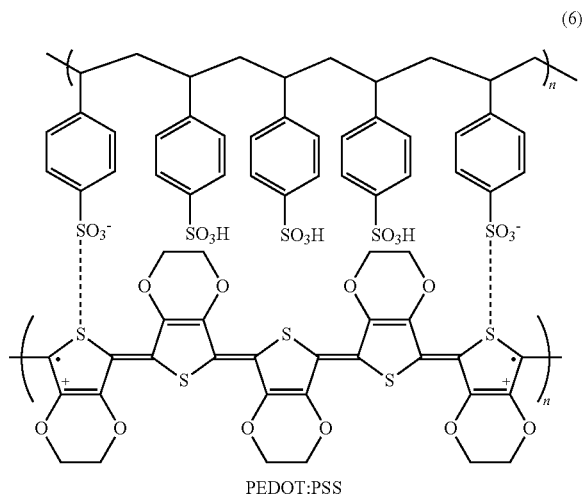

PEDOT:PSS

Furthermore, as the electron-transporting surfactant 6, a material having a ligand introduced into a material for an electron transport layer may be used.

As the material for an electron transport layer, for example, 2-(4-biphenylyl)-5-(4-t-butylphenyl)-1,3,4-oxadiazole (hereinafter referred to as "PBD") expressed by chemical formula (7), 2,2',2"-(1,3,5-benzylnitrile)-tris(1-phenyl-1-H-benzoimidazole (hereinafter referred to as "TPBi") expressed by chemical formula (8), 2,9-dimethyl-4,7-diphenyl-1,10-phenanthroline (hereinafter referred to as "BCP") expressed by chemical formula (9), 3-(benzothiazole-2-yl)-7-(diethylamino)-2H-1-benzopyran-2-one (hereinafter referred to as "Coumarin 6") expressed by chemical formula (10), bis(2-methyl-8-quinolinolate)-4-(phenylphenolate aluminum (hereinafter referred to as "BAlq") expressed by chemical formula (11), 4,4'-bis(9-carbazolyl)-2,2'-dimethylbiphenyl (hereinafter referred to as "CDBP") expressed by chemical formula (12), and derivatives thereof may be used.

[Chemical Formula 7]

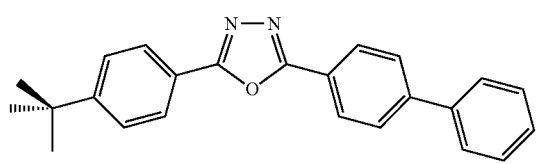

PBD

[Chemical Formula 8]

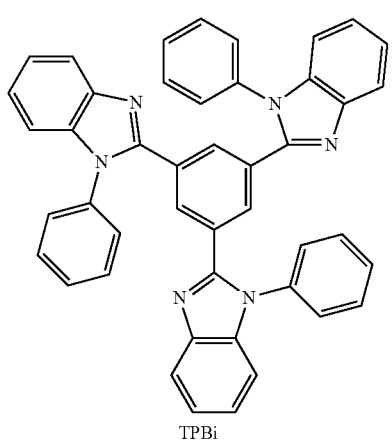

TPBi

[Chemical Formula 9]

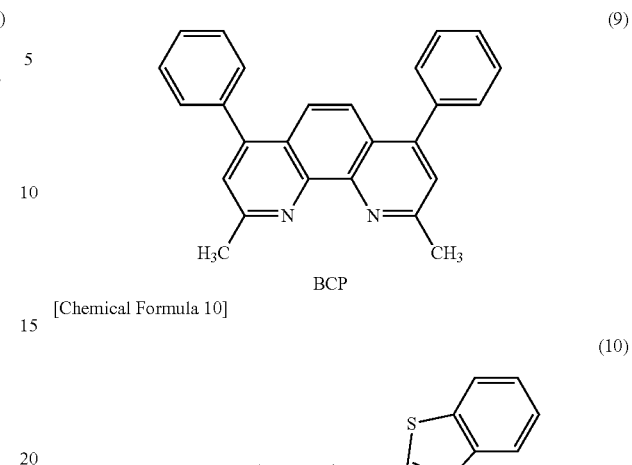

BCP

[Chemical Formula 10]

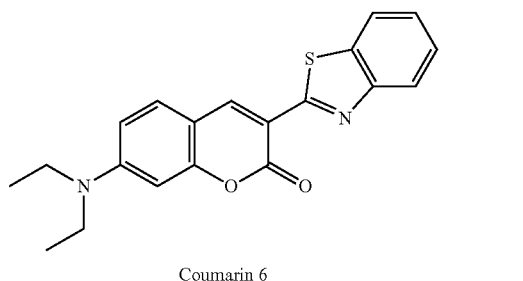

Coumarin 6

[Chemical Formula 11]

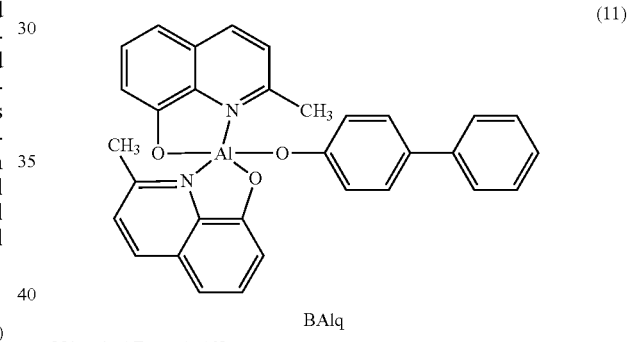

BAlq

[Chemical Formula 12]

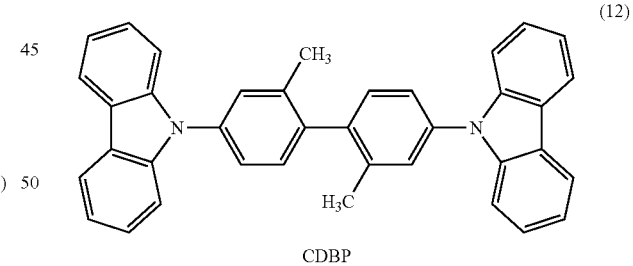

CDBP

Furthermore, as in the case of the hole-transporting surfactant 5, the ligand is not particularly limited as long as it is a polar group and for example, a thiol group (—SH), an amino group (—$NH_2$), a carboxyl group (—COOH), a carbonyl group (—CO), a nitro group (—$NO_2$), a phosphino group (—$PH_2$), a phosphoroso group (—PO) and the like may be used.

Accordingly, as the electron-transporting surfactant 6, for example, a PBD-thiol ligand having a thiol group introduced into PBD, a BCP-amino ligand having an amino group introduced into BCP or the like may be used.

Moreover, tris(8-hydroxyquinoline)aluminum (hereinafter referred to as "Alq3") expressed by chemical formula (13)

may be suitably used as a material for an electron transport layer, but is not preferable for use in the electron-transporting surfactant 6. This is because Alq3 has poor solubility, reduces the density of the ligand to compromise usability, and easily emits light, so that the electron may recombine with the hole to generate an exciton in the surfactant.

[Chemical Formula 13]

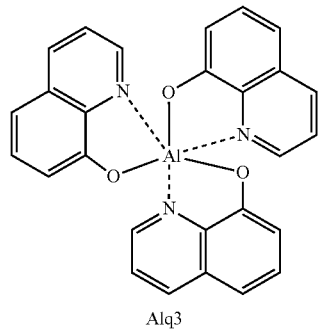

(13)

Alq3

Furthermore, it is necessary to prevent the hole-transporting surfactant 5 and the electron-transporting surfactant 6 from mixing with each other, and therefore a dispersion solvent for the hole-transporting surfactant 5 and a dispersion solvent for the electron-transporting surfactant 6 should have opposite polarities. That is, for example, if a nonpolar solvent such as toluene is used for the dispersion solvent for the hole-transporting surfactant 5, a polar solvent such as methanol should be used for the dispersion solvent for the electron-transporting surfactant 6, and for the hole-transporting surfactant 5 and the electron-transporting surfactant 6, materials which are suitable at least for these dispersion solvents are selected.

Figure 2:
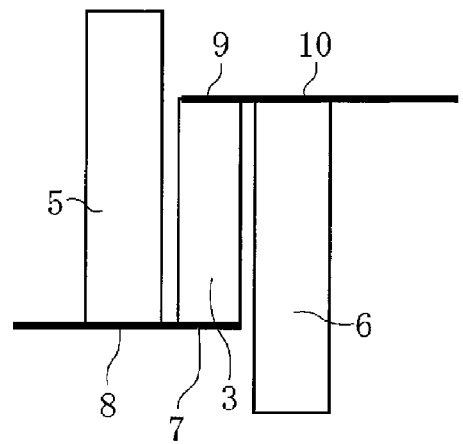
FIG. 2 is a view showing a relationship between the energy level of each surfactant and the energy level of a quantized carrier of a quantum dot.

FIG. 2 is a view showing a relationship between the energy level of the surfactants 5 and 6 and the energy level of the quantized carrier of the quantum dot 2.

That is, the hole-transporting surfactant 5 has a HOMO level 8 which tunneling-resonates with an energy level of a valence band (hereinafter referred to as "valence band level") of the core portion 3, which is an energy band allowing a hole to move therethrough, and the electron-transporting surfactant 6 has a LUMO level 10 which tunneling-resonates with an energy level 9 of a transfer band (hereinafter referred to as "transfer band level") of the core portion 3 of the quantum dot 2, which is an energy band allowing an electron to move therethrough.

By utilizing tunneling resonance in this way, the carrier can easily pass through the energy barrier, and efficient carrier movement can be achieved.

Figure 3:
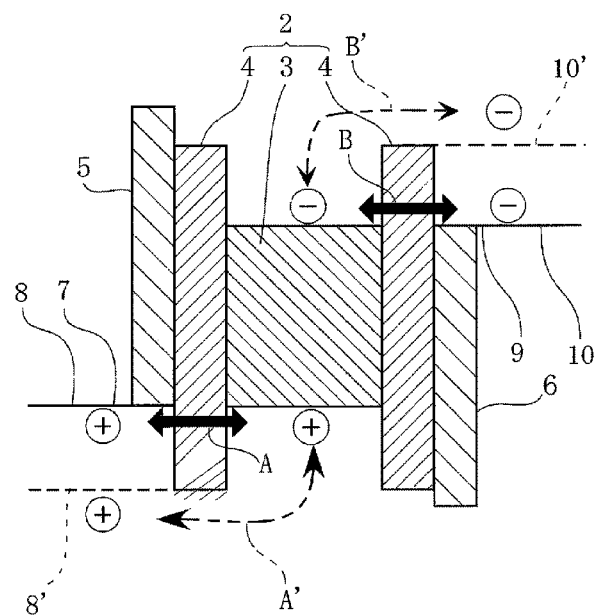
FIG. 3 is a schematic diagram showing the principle of carrier movement by tunneling resonance.

FIG. 3 is a schematic diagram showing the principle of carrier movement by tunneling resonance.

That is, the quantum dot 2 is made of the core portion 3 and the shell portion 4 as described above. The shell portion 4 is usually an ultrathin film of 1 nm or less, and therefore the carrier easily passes through the portion owing to the tunnel effect, but it is desirable that the carrier should also be quickly moved between the core portion 3 and surfactants 5, 6 to improve carrier transport efficiency.

However, if there is a large difference in energy level such that the HOMO level 8 of the hole-transporting surfactant 5 and the valence band level 7 of the core portion 3 do not tunneling-resonate with each other, the hole moves such that it overrides the energy barrier as shown in arrow A'. Similarly, if there is a large difference in energy level such that the LUMO level 10 of the electron-transporting surfactant 6 and the transfer band level 9 of the core portion 3 do not tunneling-resonate with each other, the electron moves such that it overrides the energy barrier as shown in arrow B'.

Furthermore, in the nanograin system, movement of a phonon is slow, the speed is limited by the slow movement of the phonon to cause phonon bottleneck and therefore quick movement of the carrier is difficult.

Thus, in this embodiment, the hole-transporting surfactant 5 has the HOMO level 8 which tunneling-resonates with the valence band level 7 of the core portion 3, and the electron-transporting surfactant 6 has the LUMO level 10 which tunneling-resonates with the transfer band level 9 of the core portion 3, whereby the carrier is quickly moved as shown in arrows A and B to improve carrier transport efficiency.

Furthermore, for such tunneling resonance to occur, the HOMO level 8 of the hole-transporting surfactant 5 is preferably in a range of −0.2 to +0.2 eV relative to the valence band level 7 of the core portion 3 and for example, if InP (valence band level: 5.7 eV) is used for the core portion 3, a TPD-thiol ligand (HOMO level: 5.6 eV) may be used.

Furthermore, the LUMO level 10 of the electron-transporting surfactant 6 is preferably in a range of −0.2 to +0.2 eV relative to the transfer band level 9 of the core portion 3 and for example, if InP (transfer band level: about 3 eV) is used for the core portion 3, a BCP-amino ligand (LUMO level: 3.2 eV) may be used.

A method of producing the nanograin material 1 described above will now be described.

A quantum dot dispersion solution is first prepared.

For the quantum dot 2, which is an ultrafine grain, various materials may be used as described above but in this embodiment, a case where InP is used for the core portion 3 and ZnS is used for the shell portion 4 is described as an example.

For example, indium acetate, myristic acid and octadecene are mixed in a vessel, and stirred in a nitrogen atmosphere and dissolved to thereby prepare an indium precursor solution. In addition, tristrimethylsilylphosphine, octylamine and octadecene are mixed in a nitrogen atmosphere to thereby prepare a phosphorus precursor solution.

The indium precursor solution is then heated to a predetermined temperature (e.g. 190) and the phosphorus precursor solution is injected into the heated solution. As a result, the highly active precursors react with each other under the high temperature, and indium and phosphorus are bonded together to form a nucleus, followed by reacting with surrounding unreacted components to develop crystals, whereby an InP quantum dot is prepared.

Next, a zinc oxide solution obtained by dissolving zinc oxide in stearic acid and a sulfur solution obtained by dissolving sulfur in stearic acid are prepared.

Next, slight amounts of the zinc oxide solution and the sulfur solution are alternately added dropwise to the InP quantum dot solution adjusted to a predetermined temperature (e.g. 150° C.), and the mixture is heated and cooled, and washed to remove excessive organic components in the solution. Thereafter, the resulting product is dispersed in a nonpolar solvent, for example toluene to thereby prepare an InP/ZnS dispersion solution, i.e. a quantum dot dispersion solution.

Next, the hole-transporting surfactant 5 is injected into the aforementioned quantum dot dispersion solution, and the surface of the quantum dot 2 made of InP/ZnS is covered with the hole-transporting surfactant 5 to thereby prepare a quantum dot dispersion solution with a hole-transporting surfactant (hereinafter referred to as "quantum dot dispersion solution with a hole-transporting characteristic"). Here, for the hole-transporting surfactant 5, a material having the HOMO level 8 which tunneling-resonates with the valence band level 7 (5.7 eV) of InP, which is the core portion 3, for example the aforementioned TPD-thiol ligand with the HOMO level 8 of 5.6 eV is used.

In this connection, the HOMO level 8 of the hole-transporting surfactant 5 can be determined from band gap energy estimated from a work function.

Figure 4A:
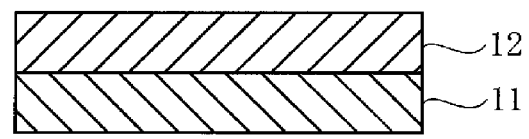
FIGS. 4(a) and 4(b) are a production flow chart showing a method of producing the nanograin material of the present invention.
Figure 4B:
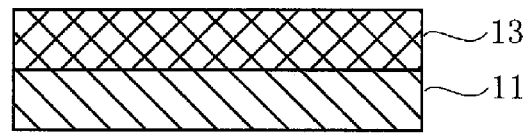

Thereafter, the nanograin material 1 is produced by a method as shown in FIGS. 4(a) and 4(b).

That is, using a spin coating process or the like, the quantum dot dispersion solution with a hole-transporting characteristic is applied to a substrate 11 to form a quantum dot layer with a hole-transporting characteristic 12 having one or more layer(s) as shown in FIG. 4(a).

A dispersion solution containing the electron-transporting surfactant 6 (hereinafter referred to as "replacement solution") is then prepared.

Here, for the dispersion solvent of the replacement solution, a solvent having a polarity opposite to that of the dispersion solvent of the quantum dot dispersion solution with a hole-transporting characteristic, for example a polar solvent such as methanol is used if toluene, which is a nonpolar solvent, is used for the dispersion solvent of the quantum dot dispersion solution with a hole-transporting characteristic as in this embodiment.

Furthermore, for the electron-transporting surfactant 6, a material having the LUMO level 10 which tunneling-resonates with the transfer band level 9 (about 3 eV) of InP, which is the core portion 3, for example the aforementioned BCP-amino ligand with the LUMO level 10 of 3.2 eV is used.

In this connection, the LUMO level 10 of the electron-transporting surfactant 6 can be determined from band gap energy estimated from a work function and an absorption end of an absorption spectrum.

Next, the substrate 11 having the quantum dot layer with a hole-transporting characteristic 12 formed on the surface is immersed in the aforementioned replacement solution and part of the hole-transporting surfactant 5 is replaced with the electron-transporting surfactant 6 to form the quantum dot layer 13 having one or more layer(s) as shown in FIG. 4(b), and this quantum dot layer 13 is the nanograin material of the present invention.

That is, when the substrate 11 having the quantum dot layer with a hole-transporting characteristic 12 formed thereon is immersed in the replacement solution, a concentration gradient is formed from the surface in the thickness direction between the hole-transporting surfactant 5 and the electron-transporting surfactant 6. The area close to the surface is replaced with the electron-transporting surfactant 6 at a higher concentration, and the area close to the substrate 11 has the hole-transporting surfactant 5 remaining at a high concentration.

A replacement ratio gradient is also generated by the film thickness and film density.

That is, in the area of the quantum dot layer with a hole-transporting characteristic 12 where the film density is low, the hole-transporting surfactant 5 is almost fully replaced with the electron-transporting surfactant 6 irrespective of the film thickness due to a sufficiently long replacement reaction, but in the area which has a high film density and is dense, only the surface is replaced, or the hole-transporting surfactant 5 remains without being replaced. In the area of the quantum dot layer with a hole-transporting characteristic 12 where the film thickness is small, even a somewhat dense film is fully replaced due to the sufficiently long replacement reaction. Furthermore, since the replacement rate decreases as going away from the surface, replacement to the electron-transporting surfactant 6 is hard to occur, and thus a gradient is generated in the ratio of replacement of the hole-transporting surfactant 5 to the electron-transporting surfactant 6.

In this way, the substrate 11 is immersed in a replacement solution to perform ligand replacement for a predetermined time period during which the hole-transporting surfactant 5 and the electron-transporting surfactant 6 are concurrently present (e.g. 60 minutes). Thus, the quantum dot layer 13, namely a nanograin material, in which quantum dots 2 covered with two kinds of surfactants, the hole-transporting surfactant 5 and the electron-transporting surfactant 6 are provided in parallel on the substrate 11 and which has a laminated structure having one or more layer(s), is prepared.

In this embodiment, the quantum dot layer with a hole-transporting characteristic 12 is formed on the substrate 11, and thereafter immersed in a replacement solution containing the electron-transporting surfactant 6, and part of the hole-transporting surfactant 5 is replaced with the electron-transporting surfactant 6 to thereby have two kinds of surfactants concurrently present, and therefore the surfactant disposed at the surface of the shell portion 4 of the quantum dot 2 is not detached from the shell portion 4. Accordingly, a nanograin material can be obtained in which the surface coverage of the surfactant covering the shell portion 4 does not decrease, inactivation of surface defects can be maintained and the quantum yield is not reduced.

Moreover, since the hole-transporting surfactant 5 and the electron-transporting surfactant 6 are concurrently present, only holes or only electrons can be transported, and carrier transport efficiency can be improved without recombination of the electron and hole in the surfactant.

Figure 5:
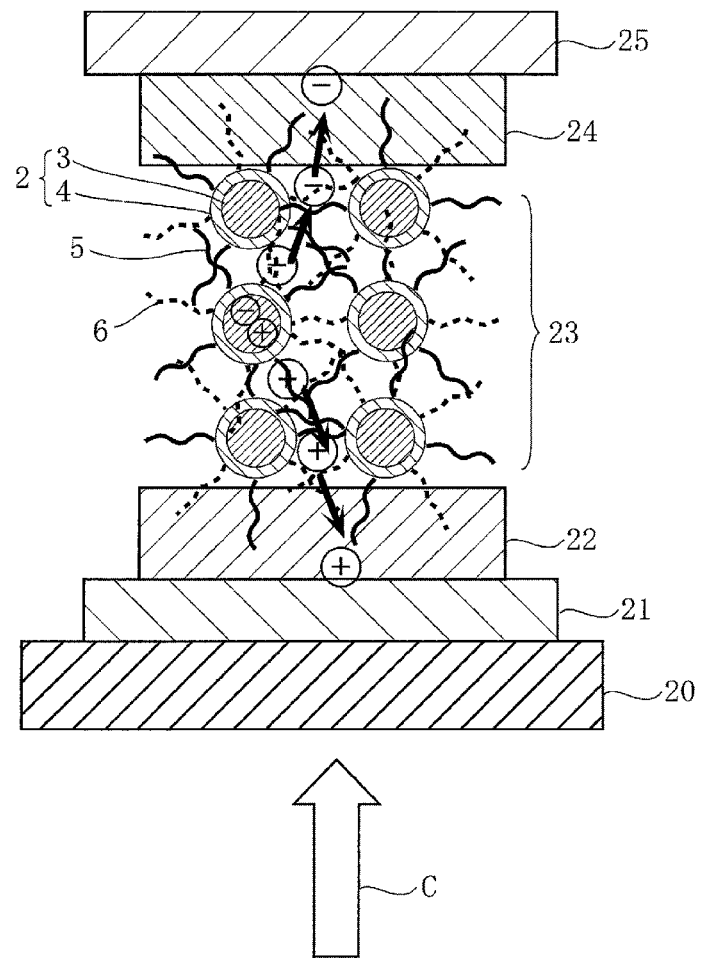
FIG. 5 is a sectional view schematically showing one embodiment of a photoelectric conversion device according to the present invention.

FIG. 5 is a sectional view schematically showing one embodiment of a solar cell as a photoelectric conversion device using the nanograin material 1 described above.

This solar cell is constituted such that an anode 21 is formed on a glass substrate 20, a hole transport layer (p layer) 22 made of a hole-transporting material is formed on the surface of the anode 21, a quantum dot layer (i layer) 23 of laminated structure formed of the nanograin material 1 of the present invention is formed on the surface of the hole transport layer 22, further an electron transport layer (n layer) 24 made of an electron-transporting material is formed on the surface of the quantum dot layer 23, and a cathode 25 is formed on the surface of the electron transport layer 24.

In this solar cell, when irradiated with light in a direction shown in arrow C, carriers are generated in the core portion 3 of the quantum dot 2 and withdrawn to outside the core portion 3 by exciton absorption. Among carriers, a hole is transported to the hole transport layer 22 through the hole-transporting surfactant 5 forming a bulk hetero network, and further transported to the anode 21. On the other hand, an electron is also transported to the electron transport layer 24 through the electron-transporting surfactant 6 forming a bulk hetero network, and further transported from the electron transport layer 24 to the cathode 25, whereby a photoelectromotive force is produced.

In this way, in the solar cell described above, the hole and the electron are transported from the quantum dot 2 by way of a different pathway through the hole-transporting surfactant 5 and the electron-transporting surfactant 6 to the hole transport layer 22 and the electron transport layer 24, respectively, and therefore the hole and the electron do not approach each other to undergo recombination, and can be efficiently transported.

Moreover, since the hole-transporting surfactant 5 has the HOMO level 8 which tunneling-resonates with the valence band level 7 of the core portion 3 and the electron-transporting surfactant 6 has the LUMO level 10 which tunneling-resonates with the transfer band level 9 of the core portion 3, and carriers can be moved quickly without occurrence of phonon bottleneck.

Figure 6A:
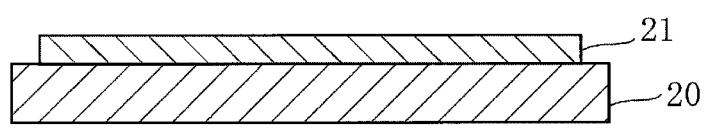
FIGS. 6(a) to 6(c) are a production flow chart (1/2) showing a method of producing the photoelectric conversion device according to the present invention.
Figure 6B:
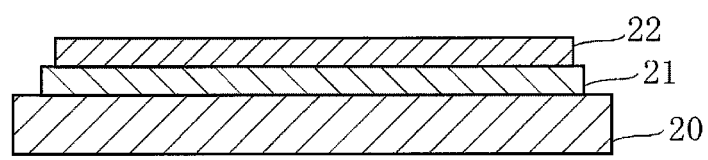
Figure 6C:
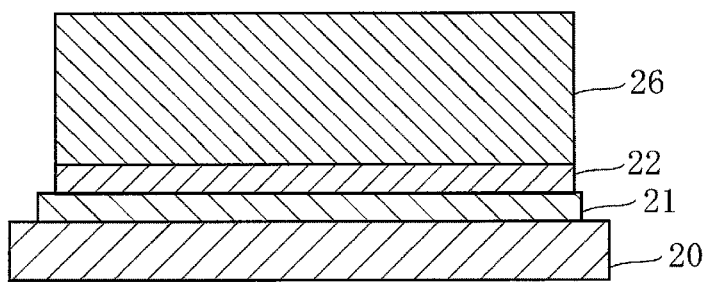

FIGS. 6(*a*) to 6(*c*) and 7(*d*) to 7(*f*) each are a production flow chart showing a method of producing the solar cell described above.

As shown in FIG. 6(*a*), an ITO film is formed on a transparent substrate 20 by a sputtering process, and subjected to UV ozonization to form the anode 21 having a thickness of 100 nm to 150 nm.

Next, a hole-transporting dispersion solution is prepared. As a hole-transporting material, PEDOT:PSS, TPD, α-NPD, 2-TNATA, Spiro-NPB, m-MTDATA and the like may be used, but a hole-transporting material soluble in a dispersion solvent having a polarity different from that of a dispersion solvent for the hole-transporting surfactant is selected and for example, if a polar solvent such as water is used as a dispersion solvent, PEDOT:PSS, which is dispersible in water, is used.

Using a spin coating process or the like, the hole-transporting dispersion solution is applied to the anode 21 to form the hole transport layer 22 having a film thickness of 20 nm to 30 nm as shown in FIG. 6(*b*).

Next, a quantum dot dispersion solution with a hole-transporting characteristic is prepared by the method described above.

Using a spin coating process or the like, the quantum dot dispersion solution with a hole-transporting characteristic is applied to the hole transport layer 22 to form a quantum dot layer with a hole-transporting characteristic 26 with a film thickness of 300 nm to 1000 nm having a laminated structure as shown in FIG. 6(*c*).

Next, the replacement solution described above is prepared. Then, the substrate 20 having the quantum dot layer with a hole-transporting characteristic 26 formed thereon is immersed in the replacement solution, and part of the TPD-thiol ligand is replaced with the BCP-amino ligand to form the quantum dot layer 23 with a thickness of 300 nm to 1000 nm in which the hole-transporting surfactant and the electron-transporting surfactant are concurrently present as shown in FIG. 7(*d*).

Figure 7D:
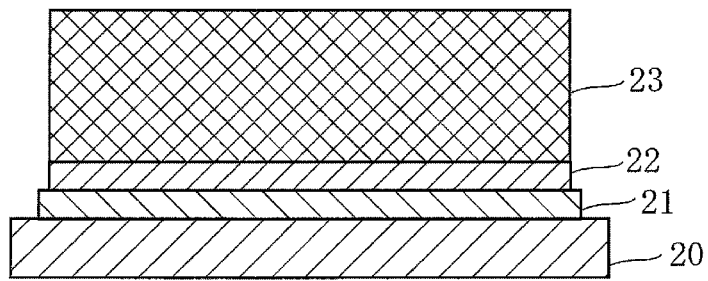
FIGS. 7(d) to 7(f) are a production flow chart (2/2) showing a method of producing the photoelectric conversion device according to the present invention.
Figure 7E:
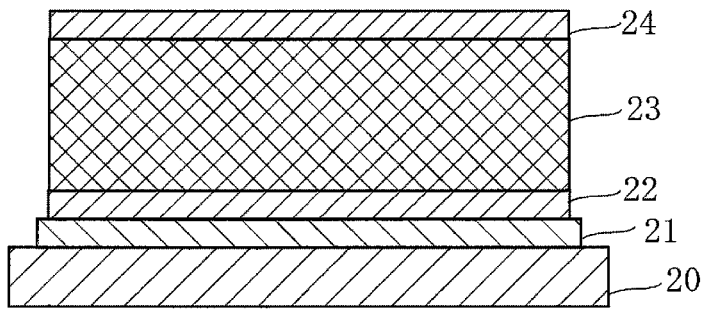
Figure 7F:
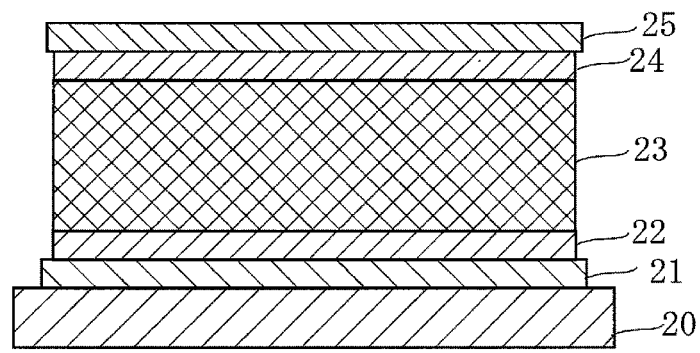

Next, an electron-transporting material such as Alq3 is used to form the electron transport layer 24 with a film thickness of 50 nm to 70 nm on the surface of the quantum dot layer 23 by a vacuum deposition process as shown in FIG. 7(*e*).

As shown in FIG. 7(*f*), Ca, Al, etc. are used to form the cathode 25 with a film thickness of 100 nm to 300 nm by a vacuum deposition process, whereby a solar cell is prepared.

Thus, in this embodiment, the hole-transporting surfactant 5 and the electron-transporting surfactant 6 are allowed to be concurrently present without reducing the coverage of the surfactant disposed at the surface of the shell portion 4, and therefore the nanograin material 1 having good carrier transport efficiency and a good quantum yield can be obtained.

Furthermore, in this embodiment, due to a concentration gradient formed in a film thickness direction, the hole-transporting surfactant 5 is replaced with the electron-transporting surfactant 6 at a higher concentration in the area close to the electron transport layer 24 while the hole-transporting surfactant 5 remains at a higher concentration in the area close to the hole transport layer 22, thus making it possible to ensure barrier properties against carriers, and therefore it is also possible to omit the hole transport layer 22 and the electron transport layer 24.

Figure 8:
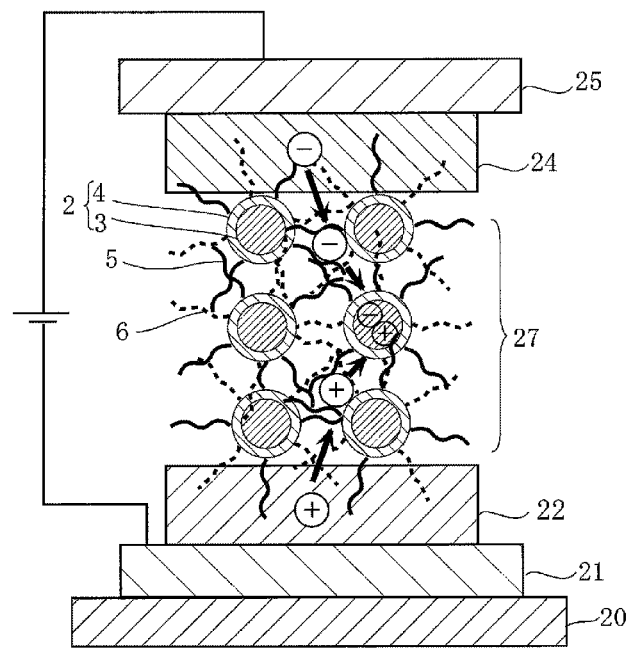
FIG. 8 is a sectional view schematically showing another embodiment of the photoelectric conversion device according to the present invention.
Figure 8:
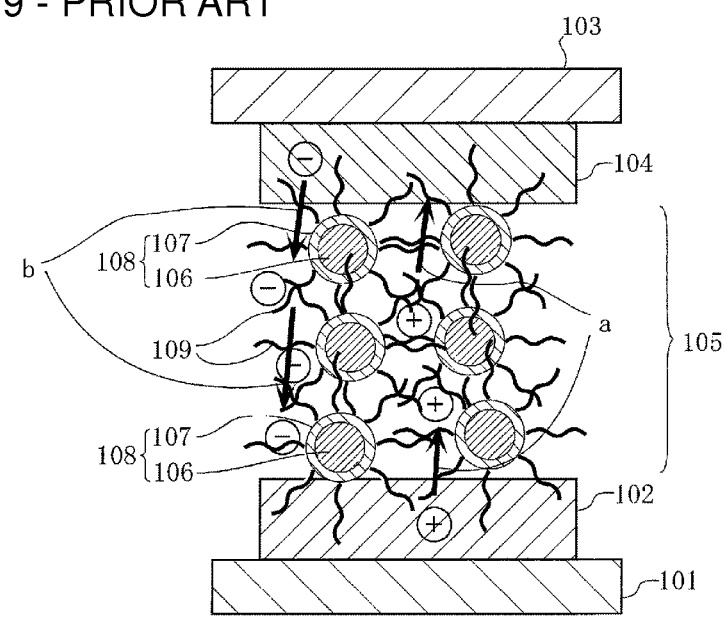

FIG. 8 is a schematic diagram showing another embodiment of the photoelectric conversion device, and the embodiment in this drawing shows the case of a light emitting diode.

That is, the light emitting diode has a structure similar to that of the solar cell described above, wherein a quantum dot layer 27 of laminated structure is interposed between the hole transport layer 22 and the electron transport layer 24.

In the light emitting diode, carriers are injected into the anode 21 and the cathode 25 when a voltage is applied. Among the injected carriers, a hole is injected into the quantum dot 2 through the hole-transporting surfactant 5 forming a bulk hetero network. On the other hand, an electron is also injected into the quantum dot 2 through the electron-transporting surfactant 6 forming a bulk hetero network and in the quantum dot 2, the hole and the electron recombine to emit light.

Moreover, the carrier is moved using tunneling resonance to inject the carrier into the quantum dot 2, and therefore carriers can be moved quickly without occurrence of phonon bottleneck.

Further, the carrier can be transported deep in a film thickness direction, and therefore high intensity light emission can be performed even though the surface density of the quantum dot 2 is not increased.

In this connection, the present invention is not limited to the embodiment described above. In the embodiment described above, the quantum dot layer with a hole-transporting characteristic 12 is formed on the substrate 11, followed by immersing the substrate 11 in a replacement solution containing the electron-transporting surfactant to prepare the quantum dot layer 13, i.e. a nanograin material, but the quantum dot layer with an electron-transporting surfactant may be formed on the substrate, followed by immersing the substrate in a replacement solution containing the hole-transporting surfactant to thereby prepare a nanograin material.

Furthermore, in the embodiment described above, the quantum dot 2 has a core-shell structure in which the core portion 3 is covered with the monolayer shell portion 4, but the invention may also be applied similarly to a core-shell-shell structure in which the shell portion has a bilayer structure and a structure in which the shell portion is absent.

Furthermore, for a photoelectric conversion device which performs conversion of a light signal to an electric signal, the invention may be applied similarly to an optical sensor and an imaging device such as CCD in addition to a solar cell. Further, for a photoelectric conversion device which performs conversion of an electric signal to a light signal, the invention may be applied similarly to a semiconductor laser and various kinds of display devices in addition to a light emitting diode.

Furthermore, in the embodiment described above, the electron transport layer 24 is prepared by a dry process using a vacuum deposition process, but may be prepared by a wet process such as a spin coating process. In this case, however, it is required to use a dispersion solvent having a polarity identical to that of a dispersion solution used in an immersion step.

Furthermore, in the embodiment described above, a polar solvent is used for the dispersion solvent for the hole transport layer material, a nonpolar solvent is used for the dispersion solvent for the hole-transporting surfactant, and a polar solvent is used for the dispersion solvent for the replacement solution, but it is only required to use solvents having opposite polarities so that they do not mix with one another in a next step, and it is also possible to use a nonpolar solvent for the dispersion solvent for the hole transport layer material, use a polar solvent for the dispersion solvent for the hole-transporting surfactant and use a nonpolar solvent for the dispersion solvent for the replacement solution, and a hole transport layer material, a hole-transporting surfactant, an electron-transporting surfactant and an electron transport layer material which are suitable for these solvents can be selected as appropriate.

Thus, a nanograin material, which has excellent carrier transport characteristics without recombination of carriers in a surfactant, can be obtained and further, carriers can be moved quickly by using tunneling resonance, and the nanograin material is useful for various kinds of photoelectric conversion devices such as a solar cell and a light emitting diode.

DESCRIPTION OF SYMBOLS 2 quantum dot
3 core portion
4 shell portion
5 hole-transporting surfactant (first surfactant)
6 electron-transporting surfactant (second surfactant)
7 valence band level
8 HOMO level
9 transfer band level
10 LUMO level
21 anode (first electrode)
22 hole transport layer
23 quantum dot layer
24 electron transport layer
25 cathode (second electrode)
27 quantum dot layer

The invention claimed is:

1. A nanograin material comprising:
an ultrafine grain having a surface thereof covered with a first surfactant having a hole-transporting characteristic and a second surfactant having an electron-transporting characteristic,
wherein the first surfactant has a HOMO level which tunneling-resonates with a valence band of the ultrafine grain.

2. The nanograin material according to claim 1, wherein the HOMO level is −0.2 to +0.2 eV relative to an energy level of the valence band.

3. The nanograin material according to claim 1, wherein the second surfactant has a LUMO level which tunneling-resonates with a transfer band of the ultrafine grain.

4. The nanograin material according to claim 3, wherein the LUMO level is −0.2 to +0.2 eV relative to an energy level of the transfer band.

5. The nanograin material according to claim 1, wherein the ultrafine grain has a core-shell structure having a core portion and a shell portion covering the core portion.

6. A photoelectric conversion device comprising:
a first electrode;
a second electrode; and
a quantum dot layer interposed between the first electrode and the second electrode, wherein the quantum dot layer is the nanograin material according to claim 1.

7. The photoelectric conversion device according to claim 6, further comprising an electron transport layer between one of (1) the first electrode and the quantum dot layer and (2) the second electrode and the quantum dot layer, and a hole transport layer is formed between the other electrode and the quantum dot layer.

8. The photoelectric conversion device according to claim 7, wherein the electron transport layer is located between the first electrode and the quantum dot layer, and a hole transport layer is located between the second electrode and the quantum dot layer.

9. The photoelectric conversion device according to claim 7, wherein the electron transport layer is located between the second electrode and the quantum dot layer, and a hole transport layer is located between the first electrode and the quantum dot layer.

10. A nanograin material comprising:
an ultrafine grain having a surface thereof covered with a first surfactant having a hole-transporting characteristic and a second surfactant having an electron-transporting characteristic,
wherein the second surfactant has a LUMO level which tunneling-resonates with a transfer band of the ultrafine grain.

11. The nanograin material according to claim 10, wherein the LUMO level is −0.2 to +0.2 eV relative to an energy level of the transfer band.

12. The nanograin material according to claim 10, wherein the ultrafine grain has a core-shell structure having a core portion and a shell portion covering the core portion.

13. A photoelectric conversion device comprising:
a first electrode;
a second electrode; and
a quantum dot layer interposed between the first electrode and the second electrode, wherein the quantum dot layer is the nanograin material according to claim 10.

14. The photoelectric conversion device according to claim 13, further comprising an electron transport layer between one of (1) the first electrode and the quantum dot layer and (2) the second electrode and the quantum dot layer, and a hole transport layer is formed between the other electrode and the quantum dot layer.

15. The photoelectric conversion device according to claim 14, wherein the electron transport layer is located between the first electrode and the quantum dot layer, and a hole transport layer is located between the second electrode and the quantum dot layer.

16. The photoelectric conversion device according to claim 14, wherein the electron transport layer is located between the second electrode and the quantum dot layer, and a hole transport layer is located between the first electrode and the quantum dot layer.

* * * * *